United States Patent
Wilt et al.

(10) Patent No.: US 9,505,031 B2
(45) Date of Patent: Nov. 29, 2016

(54) ULTRASONIC HIGH TEMPERATURE AND PRESSURE HOUSING FOR PIEZOELECTRIC-ACOUSTIC CHANNELS

(75) Inventors: Kyle R. Wilt, Sand Lake, NY (US); Henry A. Scarton, Troy, NY (US); Tristan J. Lawry, East Lyme, CT (US); Jonathan D. Ashdown, Greenwich, NY (US); Gary J. Saulnier, East Greenbush, NY (US)

(73) Assignee: RENSSELAER POLYTECHNIC INSTITUTE, Troy, NY (US)

( * ) Notice: Subject to any disclaimer, the term of this patent is extended or adjusted under 35 U.S.C. 154(b) by 295 days.

(21) Appl. No.: 14/112,459

(22) PCT Filed: Apr. 19, 2012

(86) PCT No.: PCT/US2012/034200
§ 371 (c)(1),
(2), (4) Date: Oct. 17, 2013

(87) PCT Pub. No.: WO2012/145479
PCT Pub. Date: Oct. 26, 2012

(65) Prior Publication Data
US 2014/0043944 A1 Feb. 13, 2014

Related U.S. Application Data

(60) Provisional application No. 61/517,555, filed on Apr. 21, 2011.

(51) Int. Cl.
*B06B 1/06* (2006.01)
*G10K 9/122* (2006.01)
(Continued)

(52) U.S. Cl.
CPC ............... *B06B 1/06* (2013.01); *G10K 9/122* (2013.01); *G10K 11/004* (2013.01); *H01L 41/187* (2013.01)

(58) Field of Classification Search
CPC ...... B06B 1/06; G10K 9/122; G10K 11/004; H01L 41/187
USPC ........................................................ 367/180
See application file for complete search history.

(56) References Cited

U.S. PATENT DOCUMENTS 3,745,829 A 7/1973 Franchi
4,063,049 A * 12/1977 Pipitone ............... H04R 17/00
381/173

(Continued)

OTHER PUBLICATIONS

International Search Report and Written Opinion, dated Jul. 31, 2012.

*Primary Examiner* — James Hulka
*Assistant Examiner* — John T Nolan
(74) *Attorney, Agent, or Firm* — Notaro, Michalos & Zaccaria P.C.

(57) ABSTRACT

An ultrasonic transducer with housing contains a transducer assembly, an outer housing surface being fixed against a barrier surface for transferring ultrasonic waves to and from a barrier. The housing has an inner surface with plateau. A cap closes the housing and the transducer assembly has a piezoelectric transducer with a pressure surface around its outer perimeter and an opposite vibration surface engaging the plateau. A ring engages the pressure surface for biasing the vibration surface against the plateau. A holder engages the cap, transducer and ring for positioning and a plurality of springs are spaced around the transducer perimeter and between the cap and ring for biasing the vibration surface toward or against the raised plateau. A viscous couplant is between the vibration surface and plateau for enhancing transmission of the ultrasonic waves.

20 Claims, 8 Drawing Sheets

(51) Int. Cl.
*G10K 11/00* (2006.01)
*H01L 41/187* (2006.01)

(56) References Cited

U.S. PATENT DOCUMENTS

| | | | |
|---|---|---|---|
| 4,162,111 A | 7/1979 | Brown | |
| 4,544,859 A | 10/1985 | Eoff | |
| 4,649,754 A | 3/1987 | Zacharias | |
| 4,746,831 A * | 5/1988 | Ichino | G01F 1/662 310/327 |
| 4,918,990 A | 4/1990 | Fowler et al. | |
| 5,307,325 A * | 4/1994 | Scheiber | G01P 15/18 181/122 |
| 5,354,956 A * | 10/1994 | Orban | B06B 1/0681 175/40 |
| 6,268,683 B1 * | 7/2001 | Li | G01F 1/662 310/312 |

* cited by examiner

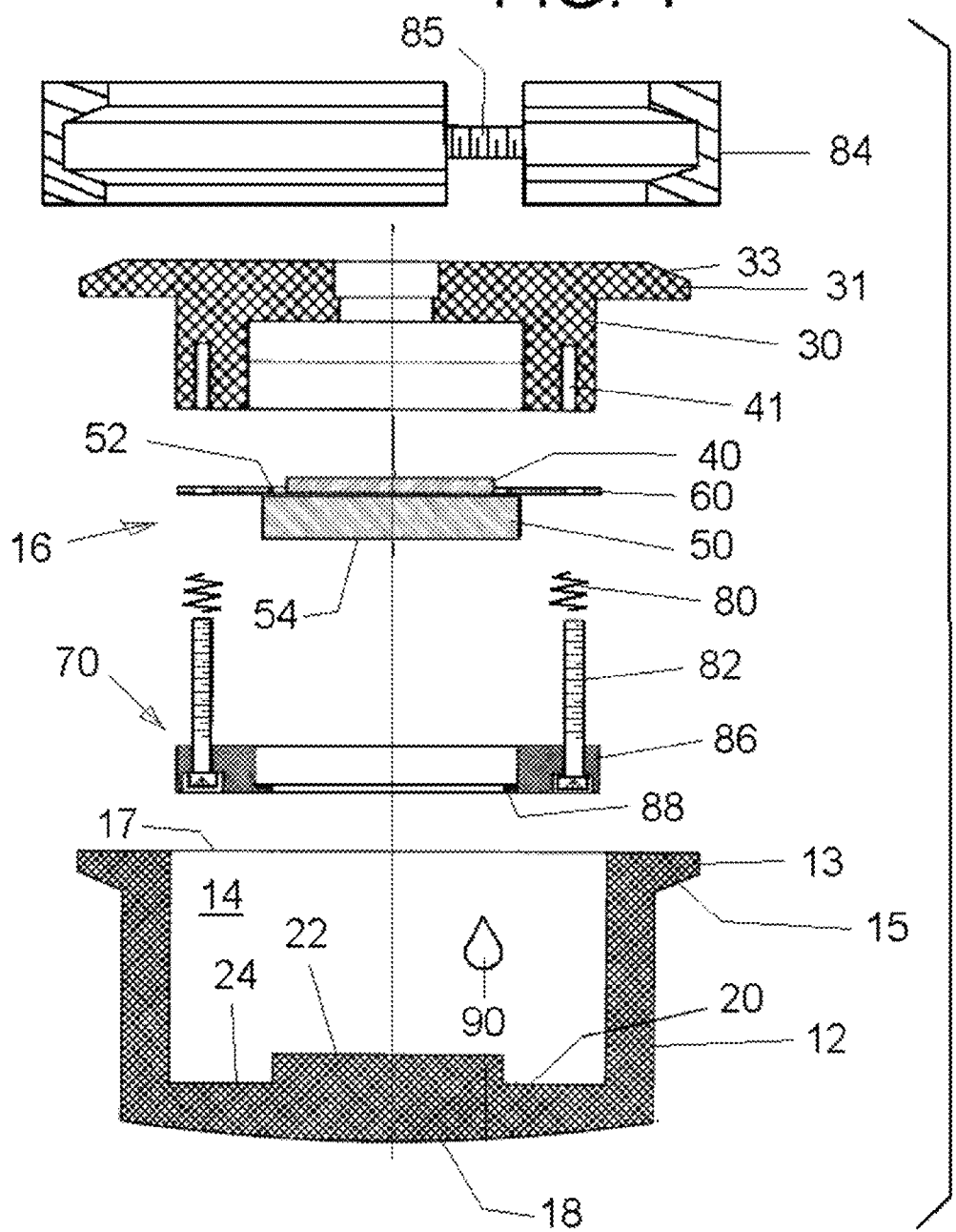

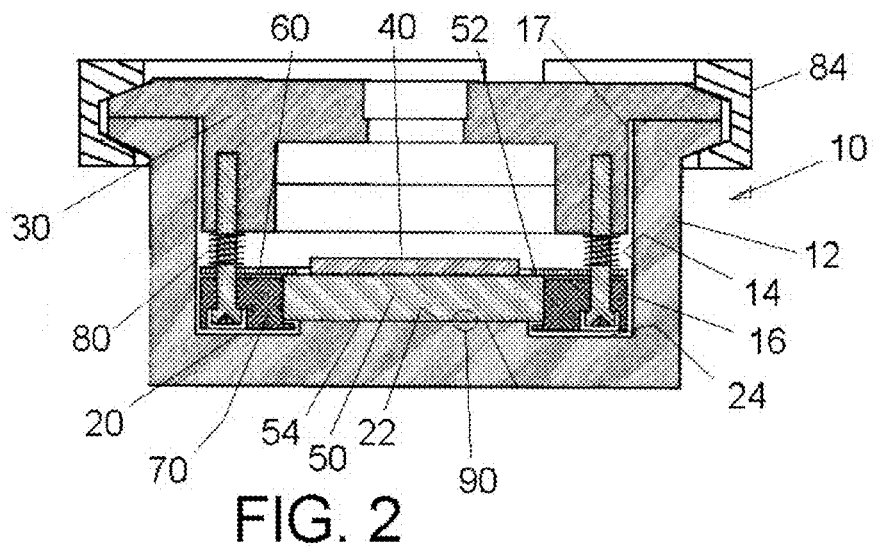
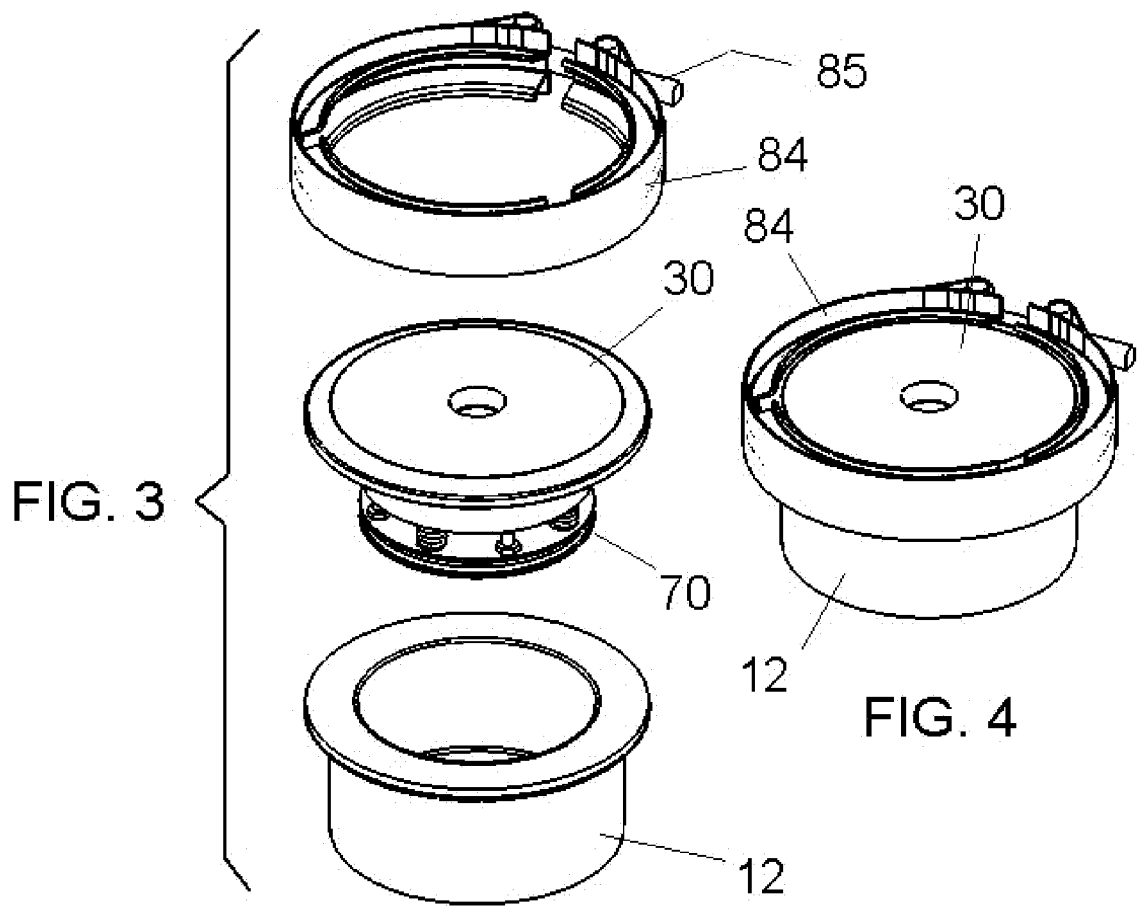

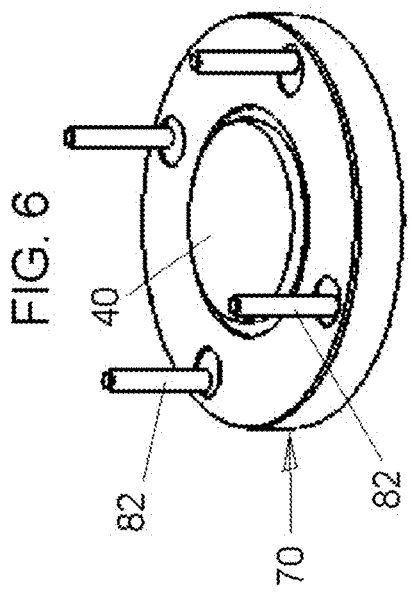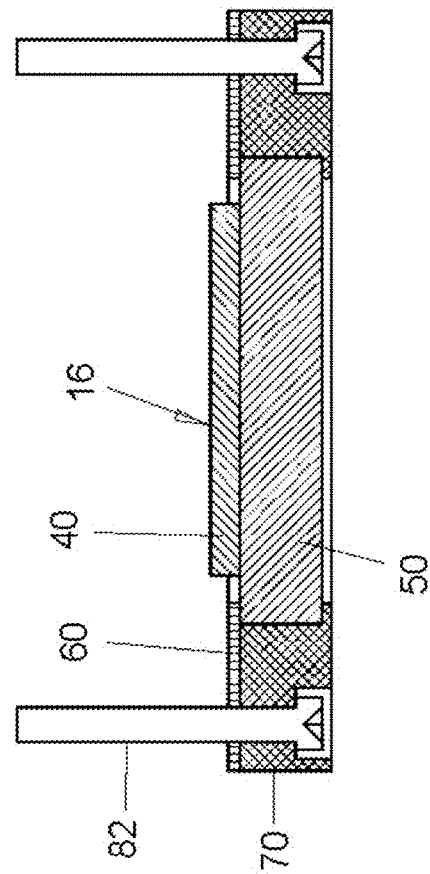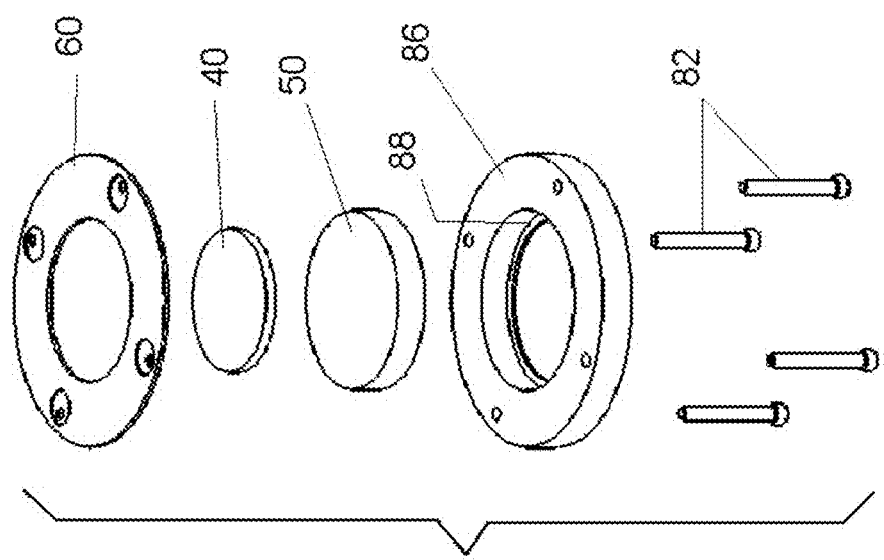

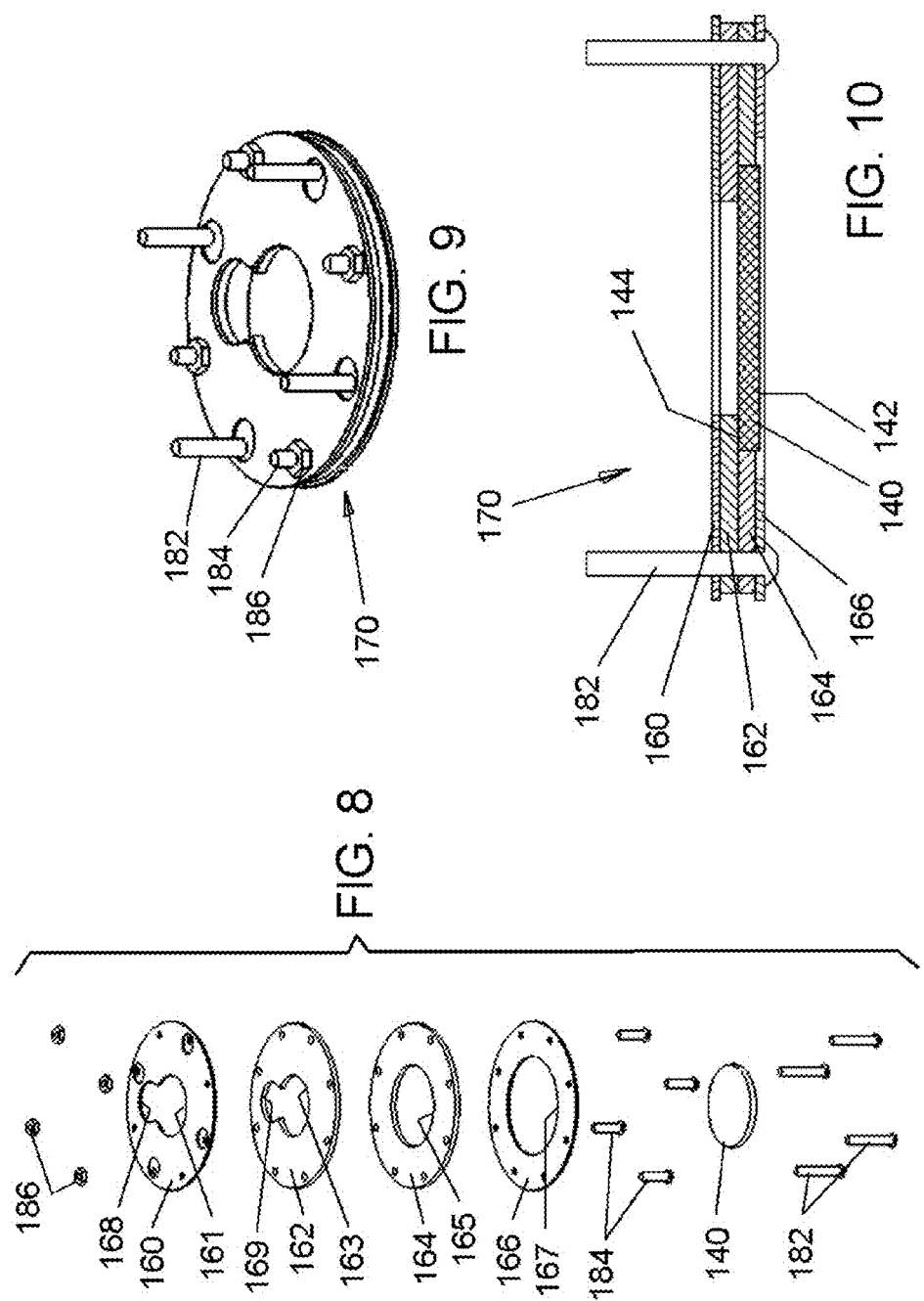

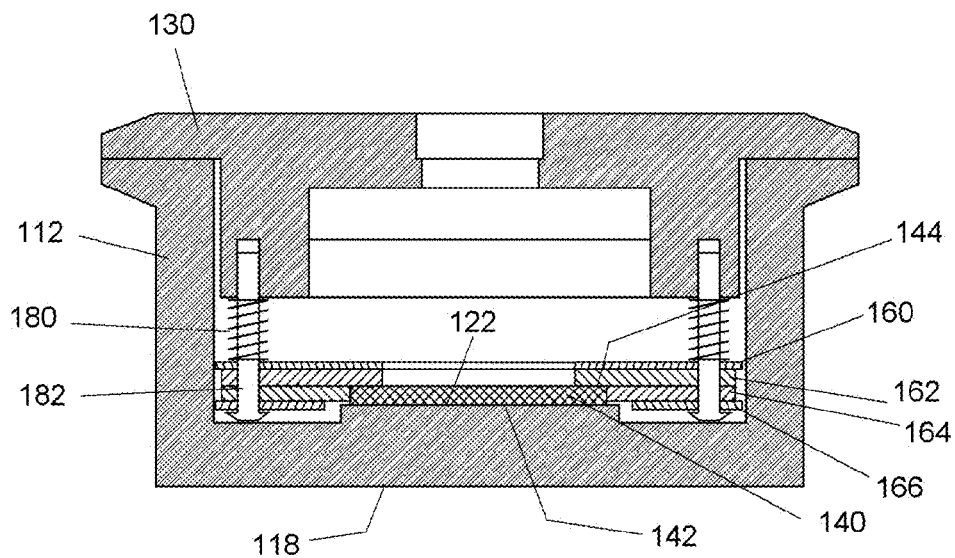
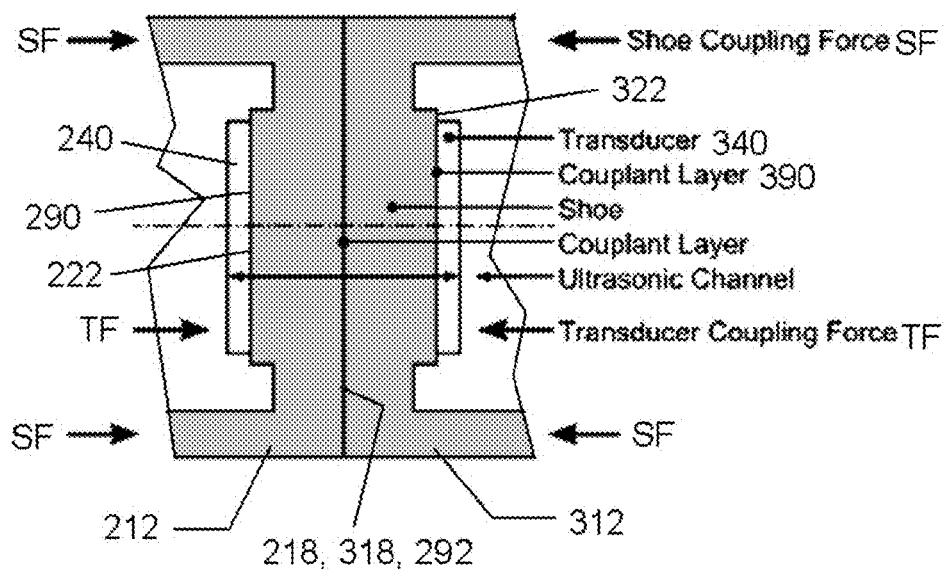

ULTRASONIC HIGH TEMPERATURE AND PRESSURE HOUSING FOR PIEZOELECTRIC-ACOUSTIC CHANNELS

FIELD AND BACKGROUND OF THE INVENTION

The present invention relates generally to the field of ultrasonic transmission and in particular to a new and useful ultrasonic transducer arrangement for transmitting and receiving ultrasonic data and power to and from a barrier.

The concept of biasing an ultrasonic transducer surface against another surface for transmitting ultrasonic waves rather than fixing the surfaces together is known in the art. The prior art, however, does not teach or suggest evenly and symmetrically distributing the pressure between the surfaces for an unexpected advantage over the prior art that had previously applied the biasing pressure centrally, thereby possibly distorting the wafer or disc shaped ultrasonic transducer and degrading its performance.

U.S. Pat. No. 4,162,111 to Brown teaches a high temperature ultrasonic transducer in which a piezoelectric crystal is held in contact with an acoustical diaphragm by a spring which also electrically couples the back face of the crystal to an electrical signal source. An oil film between the diaphragm and crystal provides an acoustical coupling. Air is used to insulate the spring electrical connection from the wall of the transducer. The oil is said to be a high temperature diffusion pump oil like "Sanzovac 5" oil from Monsanto but this is a misspelling of SANTOVAC 5 which is a polyphenyl ether diffusion pump oil.

U.S. Pat. No. 3,745,829 to Franchi; U.S. Pat. No. 4,544,859 to Eoff; U.S. Pat. No. 4,649,754 to Zacharias; U.S. Pat. No. 4,746,831 to (chino; and U.S. Pat. No. 4,918,990 to Fowler et al., also all teach biasing an ultrasonic transducer against a surface rather than fixing it to the surface, using springs, clips or clamps. Although in U.S. Pat. No. 4,918,990 to Fowler et al. the transducer has a perimeter that is pressed by a spring, only one spring is used and the pressure may tend to cant the transducer rather than evenly press it against the inner surface of the electrode tip disclosed in this references.

A need therefore remains for an effective and efficient ultrasonic transducer arrangement, particularly for high temperature and high pressure environments.

SUMMARY OF THE INVENTION

The invention disclosed here is a mechanical hardware apparatus for use in the construction of acoustic-electric channels through a thick metallic or other medium or barrier, particularly where the environment on one or both sides of the barrier is a high temperature and/or high pressure environment.

For room temperature and pressure applications, an acoustic-electric channel is formed by applying piezoelectric transducers, coaxially aligned, to opposite sides of a metallic barrier. When an AC electrical signal is applied to one transducer, the transducer will convert that energy into acoustic vibrations which are transmitted through the solid medium via longitudinal (compressive) and/or transverse (shear) waves. These acoustic vibrations are sensed and captured by the other piezoelectric transducer, which converts the mechanical acoustic energy back into an AC electrical signal. Partial acoustic reflections of the produced mechanical vibrations will be evident at the interfaces of the transducer and barrier, as the characteristic acoustic impedance of each material will be different. These reflections will produce standing wave vibrations within the acoustic channel, causing the percentage of energy transmitted through the channel to be strongly frequency dependent. Further, electrical reflections may be evident, caused by the mismatch of the effective load impedance connected to a transducers electrical leads and the effective input impedance of the transducer. These electrical reflections will cause additional acoustic reflections of the signal to be evident in the channel's operation.

Connected to the two piezoelectric transducers' electric leads is the task of specific circuitry which would be used to transmit digital or analog data and/or power. While power transmission is a one-way application, data communication may be one-way, half-duplex or full-duplex. The methods for the power and data transmission are inconsequential to this invention and are not discussed, however, for each task, the acoustic channel must be reasonably formed as to allow a useable fraction of the incident energy to pass through the system and not be lost to dispersion of the reflections or material damping.

For channels with rigidly bonded transducers, operation is limited to a range of temperatures and pressures. This is because as the temperature of the channel varies from the initial channel temperature, the transducers and barrier will expand and contract at different rates due to incompatible coefficients of thermal expansions (CTEs). These expansions or contractions, at a certain temperature difference, will cause the bonding of the transducers to fail. Variations in pressure will also affect the channel, as deformation of the barrier due to pressure changes may cause the piezoelectric transducer to flex and crack, along with possible debonding of the transducer.

The invention is meant for use in an acoustic-electric channel to avoid the problems discussed previously due to temperature and pressure fluctuations.

Accordingly it is an object of the present invention to provide an ultrasonic transducer arrangement that includes a housing for receiving a transducer assembly, the housing having an outer surface to be fixed against a barrier wall or surface for transferring ultrasonic waves to and/or from a barrier, the housing having an inner surface with a plateau surface surrounded by a lower boundary recess surface. A cap closes the housing and a transducer assembly that is connected to the cap, extends in the housing. The transducer assembly has a piezoelectric transducer with a pressure receiving surface around its outer perimeter and an ultrasonic vibration surface opposite the pressure receiving surface. A push plate or ring engages the pressure receiving surface for biasing the vibration surface against the plateau with in intermediate ceramic disc between the vibration surface and the plateau in one embodiment, or directly against the plateau. A holder engages the cap, transducer and push ring for positioning the vibration surface over the plateau and the push ring over the transducer perimeter. A plurality of springs spaced around the transducer perimeter are each engaged between the cap and the push plate for biasing the vibration surface against the raised plateau. A viscous, high-temperature couplant is provided between the vibration surface and raised plateau for enhancing transmission of the ultrasonic waves.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

BRIEF DESCRIPTION OF THE DRAWINGS

In the drawings:

FIG. 1 is an exploded sectional view of a first embodiment of the ultrasonic transducer arrangement of the invention;

FIG. 2 is a view of the ultrasonic transducer arrangement of FIG. 1 in an assembled condition;

FIG. 3 is an exploded perspective view of major subassemblies of the arrangement of FIG. 1;

FIG. 4 is a perspective view of the assembled arrangement of FIG. 2;

FIG. 5 is an exploded perspective view of some of the components of the first embodiment;

FIG. 6 is a top front perspective view of the ultrasonic transducer arrangement components of FIG. 5, in an assembled condition;

FIG. 7 is a sectional view of the ultrasonic transducer arrangement components of FIG. 6;

FIG. 8 is an exploded perspective view of ultrasonic transducer arrangement components of a second embodiment of the invention that form a transducer press assembly;

FIG. 9 is a top front perspective view of the transducer press assembly of FIG. 8, in an assembled condition;

FIG. 10 is a sectional view of the transducer press assembly of FIG. 9;

FIG. 11 is a sectional view similar to FIG. 2, of an assembled ultrasonic transducer arrangement of the second embodiment, using the transducer press assembly of FIG. 10 and with housing and insert components shown;

FIG. 12 is a simplified schematic and fragmentary sectional view of a high-temperature acoustic test channel used to verify the effectiveness of the invention;

DESCRIPTION OF THE PREFERRED EMBODIMENTS

Figure 13:
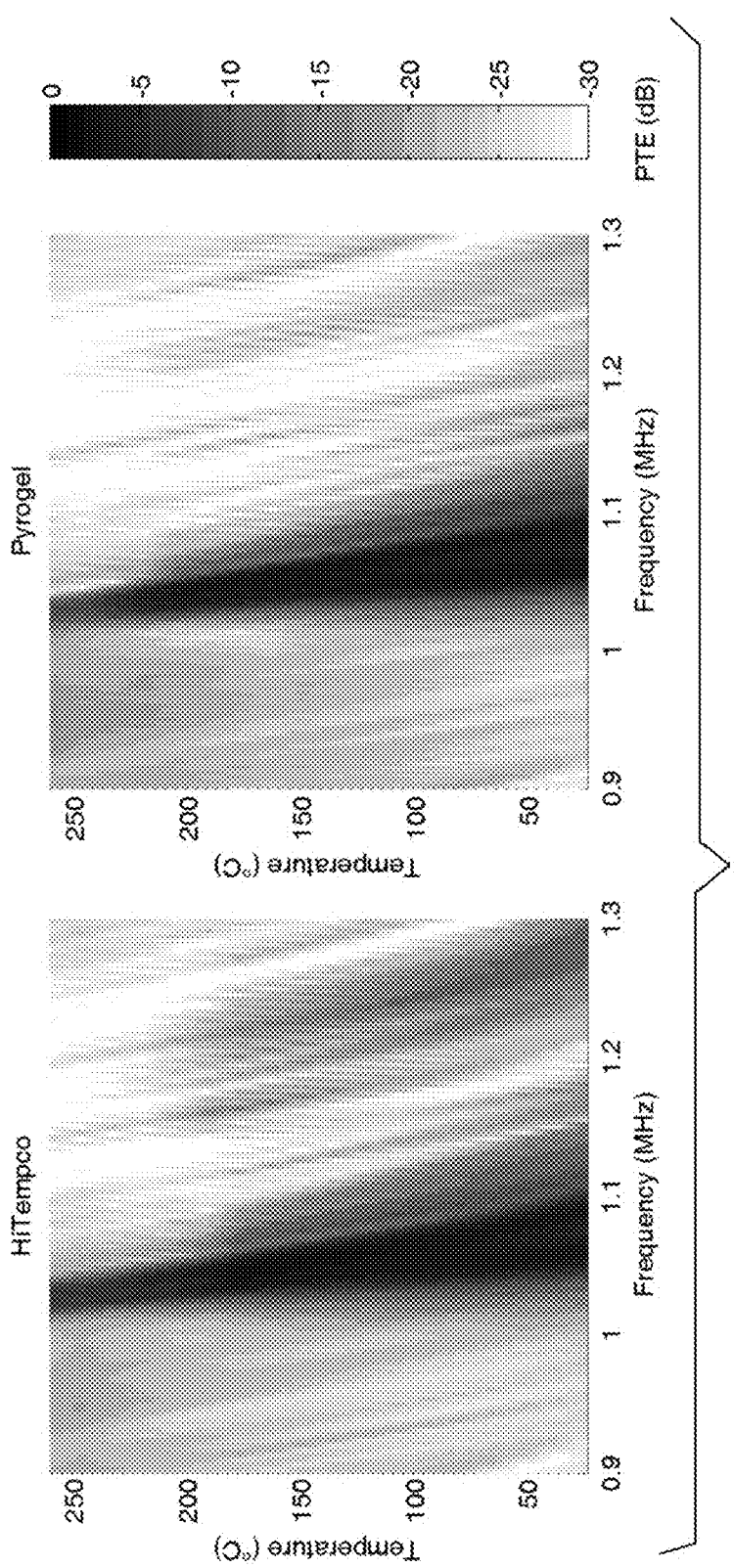
FIG. 13 is a pair of temperature-coordinated graphical representations of electrically matched power transfer efficiencies of the high-temperature acoustic test channel of FIG. 12, using HiTempco (left) and Pyrogel 100 (right) couplants.

Referring now to the drawings, in which like reference numerals are used to refer to the same or similar elements, FIGS. 1 to 7 illustrate an ultrasonic transducer arrangement that is particularly effective in an ultrasonic through-wall communication system (UTWC) in high-temperature and pressure environments. In such environments, a protective enclosure is required for both the transducer and the electronics used in the environment. Further restrictions on the design arise from the fact that the transducers, which are composed of a piezoelectric material, cannot be rigidly attached to the barrier wall (such as by using epoxy) due to incompatible CTEs, with the ratio of the CTE's for transducer and steel, for instance, being approximately 1/3. The enclosure (also referred to as the "housing"), designed with these requirements in mind, is described in the following.

The arrangement includes a housing assembly comprising two main components, a "shoe" or housing 12, and the "insert" or cap 30, where the insert or cap fits within the shoe or housing and is joined via a flange junction and a V-clamp 84 to enclose a transducer assembly 16 to be described in detail later in this disclosure. To this end, the housing 12 and the cap 30 each have a flange 13 and 31 respectively, each with oppositely facing, inclined outer surfaces 15 and 33. The arrangement includes the V-clamp 84 having inner complementary inclined surfaces for engaging around the inclined outer surfaces 15 and 33 and with the help of a V-clamp 84 and a clamp screw 85, connecting the cap 30 to the housing 15 in a secure and sealed fashion. The shoe or housing 12, whose cross-section is shown in FIGS. 1, 2 and 7, is designed so that it may be rigidly connected to a barrier wall by welding, brazing, soldering, epoxying or otherwise fixing an outer mating surface 18 of housing 12 to the barrier wall. This rigid connection is viable, while the transducer's rigid connection is not, as the shoe or housing 12 may be manufactured out of the same material or a material with a similar CTE of the barrier while also being able to match the barrier's curvature precisely.

The housing or shoe 12 is designed in the shape of a cup, with its flange 13 on the rim and a slight plateau or raised central surface 22 protruding from its interior base or inner mating surface 20, into the center 14 of the housing. This plateau 22 is meant to provide a flat, clean interface for the transducer of the transducer assembly 16, to interface with. Typically, an acoustic couplant will be required for coupling of the transducer to this plateau region. This acoustic couplant is shown schematically as a drop of couplant 90 in FIG. 1 and as a spread layer of couplant 90 in FIG. 2.

The preferred couplant is known by the trademark HiTempco couplant and is a high temperature couplant for temperatures up to 550° F. (288 deg C.). It is a high viscosity oil with toothpaste consistency. An alternate couplant used is PYROGEL couplant grade 60 or 100, from Sonotech, Inc., that is good for a temperature range of −50° to 800° F. (10 to 427 deg C.).

The insert or cap 30 is designed to fit within the shoe or housing 12 and make contact with both the transducer interface plateau and flange 13 on the shoe. The plateau interface is intended to be only a junction between the transducer and shoe, with all other surrounding insert components either moving within an annular region around the plateau 22 or staying within the main hollow region 14 of the shoe 12, with no part making axial contact with the shoe prior to application and tightening of the V-clamp 84, using circumferential tightening means for the split V-clamp such as the screw 85. To help facilitate this, lower, inner surface 20 of the housing 12 includes a lower boundary recess 24 surrounding the raised plateau 22. Screw 85 can be replaced by a quick release snap that circumferentially tightens the V-clamp 84. The use of inclined surfaces 15 and 33 on the flanges 13 and 31, and the mating inclined surfaces in the V-clamp 84, not only forces the transducer against the housing but also squeeze the two housing parts together so as to put the interface into compression.

Other clamping mechanisms can be used, other than the V-clamp 84 with screw 85 or a snap connector, and a gasket, O-ring or other physical seal can be added between the flanges 13 and 31 to insure that the interior cavity 14 of the housing 12 stays dry and is watertight.

The ultrasonic transducer arrangement 10 thus has a housing 12 having a cavity 14 for receiving a transducer assembly 16 through an opening 17 of the cavity, the housing having an outer mating surface 18 adapted to be fixed to and against a barrier surface of a barrier for transferring ultrasonic waves to and from the barrier, the housing 12 having an inner mating surface 20 opposite the outer mating surface 18, the inner mating surface 20 having a raised plateau 22 surrounded by a lower boundary recess 24. The cap 30 is connected to the housing 12 for closing the opening 17 and the transducer assembly 16 is connected to the cap 30 in a special way and extends in the cavity 14. The barrier surface to which the mating surface 18 is to be connected may be a curved surface such as the inside concave surface of a cylinder for example, or convex such as the outside surface of a cylinder, or any other shape, with the shape of the mating surface 18 being formed to match the barrier surface shape.

The transducer assembly 16 comprises a piezoelectric transducer, made up of a piezoelectric disc 40 bonded to a ceramic disc 50 in the embodiment of FIGS. 1-7. The transducer 40, 50 has a perimeter with a pressure receiving (upper in the figures) surface 52 and an ultrasonic vibration surface 54 opposite the pressure receiving surface 52. A push plate or ring 60 engages against the pressure receiving surface 52 for biasing the ultrasonic vibration surface 54 of the transducer 40, 50 against the raised plateau 22.

A holder 70 connected to the cap 30, supports and suspends the transducer 40, 50 from the cap 30 and in the housing 12. Holder 70 also carried the push plate 60 and maintains the position of the ultrasonic vibration surface 54 over the raised plateau 22 and the position of the push plate 60 over the transducer perimeter 52.

A plurality of springs 80 spaced around the transducer perimeter 52 each engage between the cap 30 and the push the ring or plate 60 for biasing the ultrasonic vibration surface 54 against the raised plateau 22. As noted, a viscous, high-temperature couplant 90 is on the raised plateau 22 and between the ultrasonic vibration surface 54 and the plateau for enhancing transmission of ultrasonic waves between the ultrasonic vibration surface 54 and the raised plateau 22.

When the V-clamp 84 is applied over inclined surface 15 and 33, of flanges 13 and 31, a coupling force is applied with circumferential tightening means 85 to the transducer interface 54, 22 via compression of springs 80 contained within the insert. This compression also allows for the insert and shoe flange connection to come into contact and to form a seal.

The housing insert can be decomposed into two main features: the "cap" and the "transducer assembly." The cap 30 provides the flange connection for the insert. Further, the cap also has an internal area capable of accepting an appropriately sized circuit board. A through-hole through the top of the cap may be added, allowing for the mounting of electrical feedthroughs to/from the isolated circuitry. This hole is not required. On the bottom face of the cap 30 is four threaded holes 41 which allow for the transducer assembly to be mounted via screws 82.

The transducer assembly section 16 of the housing insert is designed to hold the transducer and allow the transducer to interface with the communication channel via the interface plateau 22 within the housing shoe 12. For this housing, two separate embodiments of the assemblies are disclosed, one which attaches the transducer to an intermediary disc (intermediary disc assembly of FIGS. 1-7) and one which forces the transducer directly onto the communication channel (transducer press assembly of FIGS. 8-11). Both of these assemblies attach to the bottom of the cap via the four threaded holes 41 mentioned previously using appropriately dimensioned screws 82.

In between the assembly and cap, in each case, are the four springs 80 which fit over the mounting screws 82. These enable the compression of the housing insert and coupling forces for the communication interface.

The intermediary disc assembly or holder 70 plus transducer assembly 16, shown in FIG. 5, makes use of an intermediate ceramic disc 50 in the communication channel. This disc is designed such that it has a slightly larger diameter than the electrode or transducer proper 40, where the disc material's CTE is similar to that of the transducer 40 such that the transducer 40 and disc 50 may be epoxied together reliably. To couple this transducer-ceramic assembly 16 to the shoe interface, the flat rigid metallic "push plate" or ring 60 is placed against the extended diameter of the ceramic's push surface 54. This plate is then in contact with the springs between the assembly and cap. Prior to assembly, the plate 60 presses against both the ceramic disc 50 and a ring shaped ceramic cradle 86 of the holder 70, which holds the ceramic disc steady while disassembled. When the insert is clamped within the shoe 12, the springs 80 compress due to the ceramic disc being pushed towards the cap 30 by contacting the shoe's plateau 22, while the load on the ceramic cradle is released.

The ceramic cradle or cradle ring 86 includes an annular step 88 in the inside bottom of its through hole, against which an outer perimeter of the ultrasonic vibration surface 54 rests when the transducer assembly 16 is mounted to the holder 70 as shown in FIG. 7, but before this combination of holder and transducer assembly is mounted in the housing 12. When assembled as shown in FIG. 2, and fully inserted, contact between the ultrasonic vibration surface 54 and plateau 22 caused the disc 50 to rise off step 88 and be presses against the plateau 22 only by the biasing force of springs 80. Lower boundary recess 24 leaves room of the cradle 86 around the plateau 22.

With reference to FIGS. 8 to 11, a second embodiment of the invention utilizes a transducer press assembly 170 as the transducer holder. The transducer press assembly 170 does not require the transducer 140 to include a ceramic disc as in the embodiment of FIGS. 1 to 7, but rather directly couples the vibration surface 142 of the transducer 140 (in this embodiment the piezoelectric disc 140 alone is the transducer) against the plateau 122 of the shoe or housing 112. This is done by pressing against the extremities of the transducer 140 via an appropriately sized washer or "push washer" 162, which is ideally composed of an electrically non-conductive material. To press against the push washer 162 and avoid failure, a similarly dimensioned rigid metallic "push plate" or ring 160 is used. This push plate 160 and the push washer 162 have outer diameters that are small enough to fit in the cavity if housing 112 and each include a central aperture 161 and 163 that is smaller than an outside diameter of transducer 140 so that the washer 162 presses on the pressure receiving perimeter surface 144 of transducer 140. This assembly has a slightly smaller inner diameter to account for the fact that interaction is occurring on the transducer and not on an extended diameter ceramic disc.

Also, an extra off-axis hole 168 is added to push plate 160 to allow for the electrical leads of the transducer 140 to be undisturbed. An aligned similarly sized, off-axis hole 169 is also provided in push washer 162.

Replacing other parts of the ceramic cradle 86 of the first embodiment is another composite centering washer 164 with an aperture 165 that is slightly larger that the diameter of the transducer 140, to center the transducer in the assembly 170. A lower rigid metallic plate 166, termed a "sandwiching plate," is also provided. The second composite washer 164, or "centering washer," is used to align the transducer 140 radially while the sandwiching plate 166 is incorporated to maintain the assembly's configuration while not inserted within the shoe or housing 112. For this reason sandwich plate 166 has an aperture 167 that is larger then the transducer diameter.

All of the washers and plates have eight symmetric holes within them. Four of these holes are used to tighten the assembly together, from push plate 160 to sandwiching plate 166 using bolts 184 and nuts 186, while the other four holes are used to connect the assembly to the cap using screws 182 threaded into treaded holes in the cap 130. Biasing on the transducer vibration surface 142 against the plateau surface 122, as in the first embodiment, is done using a set of springs 180 engages around the screws 182 and compressed between the cap 130 and the push plate 160 cap.

The transducer 140 in this configuration is not forcefully contained with the assembly, and as such, care must be taken to ensure that the transducer does not move from its proper location while the housing is not assembled. This may be achieved by adding an electrically-insulating and viscous grease between the transducer and the push/centering washers. By adding the grease, the transducer will effectively be loosely affixed to the apparatus. As with the first embodiment, high temperature viscous couplant is provided between the vibration surface 142 and the plateau surface 122 and the outer housing surface 118 is to be fixed to the barrier wall.

As shown in FIG. 11, when the transducer 140 comes into contact with the interface plateau, the whole sandwich assembly 170 will be pushed towards the cap 130 and forced against the plateau 122 with the interconnection springs 180. The load on the screws 182 which are holding the sandwiching assembly to the cap is relieved, with all of the force of the springs being transmitted through the transducer 140.

FIG. 12 shows a prototype housing channel that was used for testing and for establishing the effectiveness of the invention. The test channel comprised first and second housings 212 and 312, with outer mating surface 218 and 318 that were presses against each other by a shoe coupling force SF and included a couplant layer 292 therebetween, of viscous, high temperature couplant. Each housing or shoe 212 and 312 included a plateau 222, 322 against which a respective transducer 240 and 340 were presses by a transducer force TF. Couplant 290 and 390 was provided between each plateau and transducer surface. The actual environment of the invention can be envisioned by a semi-infinite wall between housings 212 and 312 with couplant between each housing and the wall. The device shown in FIG. 12 was created as a compact analogy to permit easy testing in a small high-temperature oven. In actual operation, there would be an actual barrier between the two housings.

The ultrasonic transducer arrangement of the invention has also been prototyped for use in an ultrasonic communications system where the piezoelectric transducers used were 25.4 mm (1 inch) in diameter and approximately 2 mm (0.08 inch) thick. The transducers' resonance frequencies were nominally 1 MHz. Further, the prototype assumed that the circuit board, which would be contained within the device, would be 25.4×25.4 mm² (1×1 square inches).

In lieu of testing with a completed high-temperature communications board, the transducer's electrical leads were fed out of housing caps (not shown in FIG. 12) via the cap's hole meant for electrical feed-throughs and connected to a partial high-temperature electronics package.

All of the metallic parts of the housings 212, 312 were composed of a stainless steel alloy. The transducer 240 and 340 were each of the transducer press type of FIGS. 8 to 11. The washers in the assembly were composed of an aramid/buna-n composite rubber. Each piezoelectric transducer of FIG. 12 was composed of a modified BS-PT material (TRS Technologies' BT200). Three different acoustic couplants were used during testing, as discussed in the following. BS-PT is a dense fine-grain (1-x)BiScO3-xPbTiO3 ceramic with high piezoelectric coefficient.

As noted previously, epoxying of the transducer to the barrier wall is not feasible, hence, viscous acoustic couplants are used instead. These couplants require that a transducer-wall coupling force TF be applied, which is accommodated by the compression of the springs between the transducer assembly and insert cap. Further, two strict requirements of the couplants behavior are enforced: the couplant must be able to form a good acoustic transmission layer between the transducer/disc and shoe from room temperature up to 260° C. (500° F.) and the couplant must have a relatively high viscosity to ensure that the transmission layer will not flow away from the boundary over time.

Three couplants have been tested: GE Inspection Technologies' HiTempco couplant and Sonotech's Pyrogel couplants grades 60 and 100, which correspond to dynamic viscosities of 0.55 and >4 Pascal Second (Newton second per square meter), respectively. The testing of the system with these couplants was performed using the two of the described housings 212 and 312, with the shoes of each housing in direct contact with the other at surfaces 218 and 318, essentially forming a communications barrier, or "channel". Further, for initial testing the shoes or housings 212 and 312 were not rigidly attached together, instead they were coupled using the same acoustic couplant 292 being used between the transducers and shoes. This introduces a third couplant interface which will deteriorate system performance as compared to the case of two shoes being connected via a well-developed rigid connection.

To characterize the performance of the system, the electrically matched power transfer efficiencies were computed and compared over various frequencies (0.9-1.3 MHz) and temperatures (24 to 260° C. or 75 to 500° F.). See *Electrical optimization of power delivery through thick steel barriers using piezoelectric transducers*. Lawry, T. J., Wilt, K. R., Roa-Prada, S., Ashdown, J. D., Saulnier, G. J., Scarton, H. A., Das, P. K., Pinezich, J. D. 2010. SPIE Energy Harvesting and Storage: Materials, Devices, and Applications.

The electrically matched power transfer efficiency is the maximum amount of power transfer possible through the channel where the channel is excited by a single frequency tone. The power transfer efficiency considered here, which is also known as the transducer power gain, is calculated as the total power consumed by the electrical load connected to the receive transducer over the total power available from the source. The electrically matched power transfer efficiency is the transducer power gain with the electrical power reflections stemming from the source and load electrical impedances are removed. This value is physically realizable using impedance matching networks.

The results of these tests for the HiTempco and Pyrogel 100 couplants are presented in FIG. 13. Pyrogel 60 couplant results are not presented as they were significantly worse than that of the HiTempco and Pyrogel 100 couplants.

Figure 14:
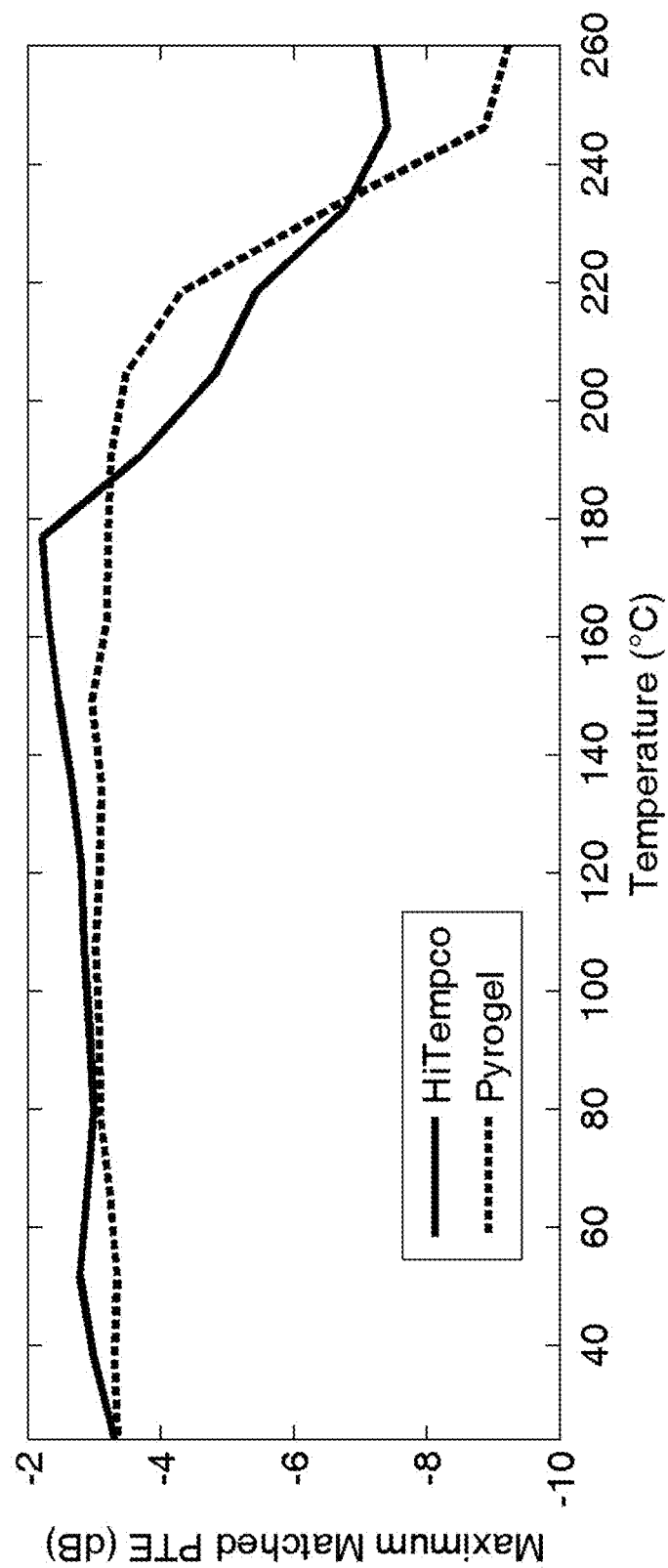
FIG. 14 is a graph showing maximum values of the electrically matched power transfer efficiencies presented in FIG. 13 plotted against temperature.

These responses show that the system behaved quite similarly between the two couplants, although the HiTempco couplant presented a superior bandwidth at low temperatures and Pyrogel 100 gave a more stable maximum response in terms of temperature dependence. This is evident when looking at a plot of the maximum values of the Power Transfer Efficiency (PTE in dB) with respect to temperature, as shown in FIGS. 13 and 14.

Communication through the channel, at 50 kbps, was also achieved using room temperature circuitry while the acoustic channel was under an elevated temperature condition (260° C. or 500° F.). The communication method and protocol used during this testing are described in *An ultrasonic through-wall communication system with power harvesting*. Shoudy, D. A., Saulnier, G. J., Das, P. K., Roa-Prada, S., Ashdown, J. D., Gavens, A. J. 2007. IEEE Ultrasonics Symposium. pp. 1848-1853. The high-temperature circuitry is described in *A high-temperature acoustic-electric system for power delivery and data communication through thick metallic barriers*. Lawry, T. J., Wilt, K. R., Roa-Prada, S., Ashdown, J. D., Saulnier, G. J., Scarton, H. A., Das, P. K., Gavens, A. J. 2011. SPIE Energy Harvesting and Storage: Materials, Devices, and Applications II.

Figure 15:
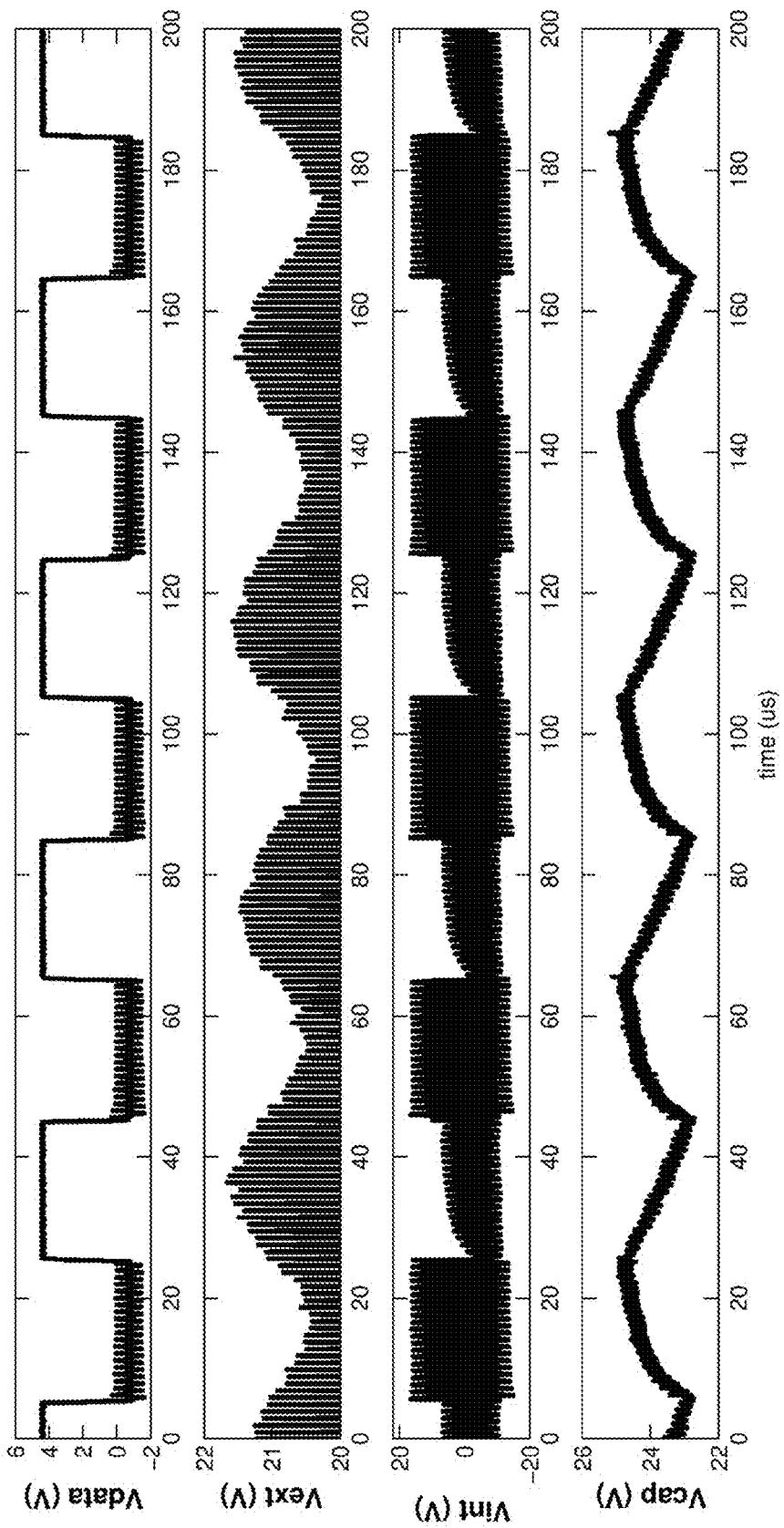
FIG. 15 is a set of time-coordinated graphs showing the operation of the prototype acoustic channel of FIG. 12, with a partial high-temperature electronics package at 260° C. with an effective communication rate of 50 kbps.

Shown in FIG. 15 are four monitored voltages which were monitored during the test. The most important of these voltages for consideration here is the Vext plot. This plot clearly shows a detectable difference between the transmissions of single bits through the acoustic channel, which were created via amplitude modulation of an input carrier wave.

While specific embodiments of the invention have been shown and described in detail to illustrate the application of the principles of the invention, it will be understood that the invention may be embodied otherwise without departing from such principles.

What is claimed is:

1. An ultrasonic transducer arrangement (10) comprising:
 a housing (12) having a cavity (14) for receiving a transducer assembly (16) through an opening (17) of the cavity, the housing having an outer mating surface (18) adapted to be fixed to and against a barrier surface of a barrier for transferring ultrasonic waves to and from the barrier, the housing (12) having an inner mating surface (20) opposite the outer mating surface (18), the inner mating surface (20) having a raised plateau (22) surrounded by a lower boundary recess (24);
 a cap (30) connected to the housing (12) for closing the opening (17); and
 a transducer assembly (16) connected to the cap (30) and extending into the cavity (14);
 the transducer assembly (16) comprising:
 a piezoelectric transducer (40, 50) having a perimeter with a pressure receiving surface (52), and an ultrasonic vibration surface (54) opposite the pressure receiving surface;
 a push plate (60) engaged against the pressure receiving surface (52) and biasing the ultrasonic vibration surface (54) of the transducer (40, 50) against the raised plateau (22);
 a holder (70) connected to the cap (30), and carrying the transducer (40, 50) and the push plate (60), the holder (70) maintaining an axial position of the ultrasonic vibration surface (54) over the raised plateau (22) and an axial position of the push plate (60) over the transducer perimeter (52),
 wherein the push plate (60) is axially between the cap (30) and the holder (70), and is capable of axial movement with respect to both the cap (30) and the holder (70);
 wherein the holder (70) comprises a cradle ring (86) including an axial through hole, and the transducer (40,50) is positioned so that at least part of the ultrasonic vibration surface (54) of the transducer spans and is axially aligned with both the through hole, and is also axially aligned with the raised plateau (22); and
 a plurality of springs (80) spaced around the transducer perimeter and each engaged between the cap (30) and the push plate (60), the springs (80) biasing the push plate (60) towards the holder (70) and towards the inner mating surface (20) of the housing, and biasing the ultrasonic vibration surface (54) against the raised plateau (22) through the push plate (60), the raised plateau (22) contacting a portion of the vibration surface (54) which is axially aligned with said through hole; and
 a viscous, fluid couplant (90) on the raised plateau (22), between the ultrasonic vibration surface (54) and the plateau for enhancing transmission of ultrasonic waves between the ultrasonic vibration surface (54) and the raised plateau (22);
 wherein the cradle ring (86) of the holder (70) is positioned at least partially within the lower boundary recess (24) surrounding the plateau (22).

2. The ultrasonic transducer arrangement according to claim 1:
 wherein the push plate (60) is in the form of a flat, round push ring (60) having a central hole; and
 wherein a portion of the piezoelectric transducer (40) is positioned through and within the central hole of the push ring (60).

3. The ultrasonic transducer arrangement according to claim 1,
 wherein the transducer comprises a piezoelectric disc (40) and a ceramic disc (50) fixed to the piezoelectric disc,
 wherein an outer surface of the ceramic disc (50) comprises the ultrasonic vibration surface (54);
 wherein the piezoelectric disc (40) has a smaller diameter than the ceramic disc (50), and is fixed to a top side of the ceramic disc (50) which is opposite the ultrasonic vibration surface (54); and
 wherein the pressure receiving surface (52) comprises a portion of the top side of the ceramic disc which is not covered by the piezoelectric disc (40) attached thereto.

4. The ultrasonic transducer arrangement according to claim 1, wherein the transducer comprises a piezoelectric disc (40), an outer surface of the piezoelectric disc comprising the vibration surface.

5. The ultrasonic transducer arrangement according to claim 1, wherein the springs (80) spaced around the transducer perimeter (52) are each aligned over and outside of the lower boundary recess (24), are spaced apart from the raised plateau (22).

6. The ultrasonic transducer arrangement according to claim 1, wherein the housing (12) and the cap (30) each have flanges (13, 31) with inclined outer surfaces (15, 33), the arrangement including a V-clamp (84) having inner inclined surfaces for engaging around the inclined outer surfaces for connecting the cap to the housing, and consequently, squeezing the flanges together to act as a seal.

7. The ultrasonic transducer arrangement according to claim 1,
 wherein the transducer comprises a piezoelectric disc (40) and a ceramic disc (50) fixed to the piezoelectric disc,
 wherein an outer surface of the ceramic disc (50) comprises the ultrasonic vibration surface (54);
 wherein the piezoelectric disc (40) has a smaller footprint than the ceramic disc (50), and is fixed to a top side of the ceramic disc (50) which is opposite the ultrasonic vibration surface (54)

wherein the pressure receiving surface (52) is a portion of the top side of the ceramic disc (50) which is not covered by the piezoelectric disc (40) attached thereto;

wherein the push plate (60) is in the form of a round push ring (60) having a central hole;

wherein the piezoelectric disc (40) of the piezoelectric transducer is positioned through the central hole of the push ring (60); and wherein the push ring (60) is biased against the pressure receiving surface (52) on the top side of the ceramic disc (50) by the springs (80).

8. The ultrasonic transducer arrangement according to claim 1, wherein the cap includes an internal volume adapted for accepting a circuit board and a through-hole through the top of the cap for mounting electrical feedthroughs.

9. The ultrasonic transducer arrangement according to claim 1, wherein the holder (70) comprises a round cradle ring (86) including a through hole with an annular step (88) in the through hole, wherein said annular step (88) frames a portion of the ultrasonic vibration surface (54) of the piezoelectric transducer (40, 50), and wherein an outer perimeter of the piezoelectric transducer (40, 50) rests under a bias of the springs (80) against the step (88) before the transducer assembly (16) extends into the cavity (14), wherein the cradle is dimensioned so that the outer perimeter of the piezoelectric transducer (40, 50) is able to rise off the step (88) against the bias of the springs (80) when the ultrasonic vibration surface (54) engages with and rests on the plateau (22), the recess (24) receiving and containing at least a portion of the cradle ring (86) around the plateau (22) when the transducer assembly (16) is in the cavity (14).

10. The ultrasonic transducer arrangement according to claim 1, wherein the transducer (140) comprises a piezoelectric disc having the vibration surface (142) and the opposite pressure receiving surface (144), the holder (170) comprising a centering washer (164) having an aperture (165) for closely receiving and centering the transducer (140) in the holder, a sandwich plate (166) under the centering plate, a push washer (162) of electrically non-conductive material between the push plate (160) and the centering washer (164), the push plate and push washer each include an aperture (161, 163) that is smaller than an outside diameter of transducer (140), and a plurality of fasteners (184, 186) for fastening the sandwich plate to the push plate with the push washer and centering washer therebetween.

11. The ultrasonic transducer arrangement according to claim 1, wherein the transducer (140) comprises a piezoelectric disc having the vibration surface (142) and the opposite pressure receiving surface (144), the holder (170) comprising a centering washer (164) having an aperture (165) for closely receiving and centering the transducer (140) in the holder, a sandwich plate (166) under the centering plate, a push washer (162) between the push plate (160) and the centering washer (164), the push plate and push washer each include an aperture (161, 163) that is smaller than on outside diameter of transducer (140), and a plurality of fasteners (184, 186) for fastening the sandwich plate to the push plate with the push washer and centering washer therebetween, the push plate and the push washer having off set holes (168, 169) communicating with the apertures (161, 163) thereof for passage of electrical leads for the transducer (140).

12. An ultrasonic transducer arrangement comprising:

a housing (12) having a cavity (14) for receiving a transducer assembly (16) through an opening (17) of the cavity, the housing having an outer mating surface (18) adapted to be fixed to and against a barrier surface of a barrier for transferring ultrasonic waves to and from the barrier, the housing (12) having an inner mating surface (20) opposite the outer mating surface (18), the inner mating surface (20) having a raised plateau (22) surrounded by a lower boundary recess (24);

a cap (30) connected to the housing (12) for closing the opening (17); and a transducer assembly (16) extending into the cavity (14); the transducer assembly (16) comprising:

a piezoelectric transducer (40, 50) having a perimeter with a pressure receiving surface (52), and an ultrasonic vibration surface (54) opposite the pressure receiving surface;

a push plate (60) engaged against the pressure receiving surface (52) and biasing the ultrasonic vibration surface (54) of the transducer (40, 50) against the raised plateau (22);

a holder (70) connected to the cap (30), and carrying the transducer (40, 50) and the push plate (60), the holder (70) maintaining an axial position of the ultrasonic vibration surface (54) over the raised plateau (22) and an axial position of the push plate (60) over the transducer perimeter (52), wherein the holder (70) comprises an axial through hole, and the transducer (40,50) is positioned so that at least part of the ultrasonic vibration surface (54) of the transducer is axially aligned over the through hole, and is also axially aligned with the raised plateau (22); and a plurality of springs (80) spaced around the transducer perimeter and each engaged between the cap (30) and the push plate (60), the springs (80) biasing the push plate (60) towards the inner mating surface (20) of the housing, and biasing the ultrasonic vibration surface (54) against the raised plateau (22) via the push plate (60), wherein the raised plateau (22) is positioned at least partially within the axial through hole of the holder (70), and the raised plateau (22) is thereby in contact with a portion of the vibration surface (54) which is axially aligned with said through hole.

13. The ultrasonic transducer arrangement according to claim 12, wherein the transducer comprises a piezoelectric disc (40) and a ceramic disc (50) fixed to the piezoelectric disc, wherein an outer surface of the ceramic disc (50) comprises the ultrasonic vibration surface (54);

wherein the piezoelectric disc (40) has a smaller diameter than the ceramic disc (50), and is fixed to a top side of the ceramic disc (50) which is opposite the ultrasonic vibration surface (54)

wherein the pressure receiving surface (52) comprises a portion of the top side of the ceramic disc (50) which is not covered by the piezoelectric disc (40) attached thereto;

wherein the push plate (60) has an axial hole there through;

wherein the piezoelectric disc (40) of the piezoelectric transducer is positioned through and within the axial hole of the push plate (60); and wherein the push plate (60) is biased against the pressure receiving surface (52) on the top side of the ceramic disc (50) by the springs (80), and it not biased directly against the piezoelectric disc (40).

14. The ultrasonic transducer arrangement according to claim 12, wherein the transducer comprises a piezoelectric disc, an outer surface of the piezoelectric disc comprising the vibration surface.

15. The ultrasonic transducer arrangement according to claim 12,
    wherein the holder (70) is mounted to the cap (30) by a plurality of mounting screws 62;
    wherein the push plate (60) comprises a plurality of screw holes there through,
    wherein the mounting screws (62) pass through respective screw holes in the push plate (60), and wherein the push plate (60) is located axially between the cap (30) and the holder (70); and
    wherein a plurality of said springs (80) are positioned over respective mounting screws (62), the screws being axially between the cap (30) and the push plate (60) and biasing the push plate (60) towards the holder (70) and away from the cap (30).

16. The ultrasonic transducer arrangement according to claim 12, wherein the housing and the cap each have flanges with inclined surfaces, the arrangement including a clamp for engaging around the inclined surfaces for connecting the cap to the housing.

17. The ultrasonic transducer arrangement according to claim 12,
    wherein the holder (70) comprises a round cradle ring (86) having an axial through hole; and
    wherein the cradle ring (86) of the holder (70) is positioned at least partially within the lower boundary recess (24) surrounding the plateau (22).

18. The ultrasonic transducer arrangement according to claim 12, wherein the holder comprises a cradle ring with through hole and step, the piezoelectric transducer resting against the step before the transducer assembly extends into the housing, the piezoelectric transducer rising off the step when the vibration surface engages the plateau.

19. The ultrasonic transducer arrangement according to claim 12, wherein the transducer comprises a piezoelectric disc having the vibration surface and the pressure receiving surface, the holder comprising a centering washer having an aperture for centering the transducer in the holder, a sandwich plate under the centering plate, a push washer of electrically non-conductive material between the push plate and the centering washer, the push plate and push washer each include an aperture that is smaller than on outside diameter of transducer, and a plurality of fasteners for fastening the sandwich plate to the push plate with the push washer and centering washer therebetween.

20. An ultrasonic transducer arrangement comprising:
    a housing (12) having a cavity (14) for receiving a transducer assembly (16) through an opening (17) of the cavity, the housing having an outer mating surface (18) adapted to be fixed to a barrier surface of a barrier for transferring ultrasonic waves to and from the barrier, the housing (12) having an inner mating surface (20) opposite the outer mating surface (18), the inner mating surface (20) having a raised plateau (22) surrounded by a lower boundary recess (24);
    a cap (30) connected to the housing (12) for closing the opening (17); and
    a transducer assembly (16) extending into the cavity (14), the transducer assembly (16) comprising:
        a piezoelectric transducer (40, 50) wherein the transducer comprises a piezoelectric disc (40) and a ceramic disc (50) fixed to the piezoelectric disc, wherein an outer surface of the ceramic disc (50) comprises the ultrasonic vibration surface (54), wherein the piezoelectric disc (40) has a smaller footprint than the ceramic disc (50) and is fixed to a top side of the ceramic disc (50) which is opposite the ultrasonic vibration surface (54), and wherein the pressure receiving surface (52) is a portion of the top side of the ceramic disc (50) which is not covered by the piezoelectric disc (40) attached thereto;
        a push plate (60) having a through hole, the push plate (60) being engaged against the pressure receiving surface (52) and biasing the ultrasonic vibration surface (54) of the transducer (40, 50) against the raised plateau (22), and wherein the piezoelectric disc (40) is positioned within the through hole of the push plate (60);
        a holder (70) carrying the transducer (40, 50) and the push plate (60),
        wherein the holder (70) comprises an axial through hole, and the transducer (40,50) is positioned so that at least part of the ultrasonic vibration surface (54) of the transducer is axially aligned over the through hole; and
        a plurality of springs (80) spaced around the transducer perimeter and each engaged between the cap (30) and the push plate (60), the springs (80) biasing the push plate (60) towards the inner mating surface (20) of the housing, and biasing the ultrasonic vibration surface (54) against the raised plateau (22) via the push plate (60);
    wherein the raised plateau (22) is positioned at least partially within the axial through hole of the holder (70), and the raised plateau (22) is thereby is in contact with a portion of the vibration surface (54) which is also axially aligned with said through hole.

* * * * *